(12) United States Patent
Hosseini et al.

(10) Patent No.: US 9,362,191 B2
(45) Date of Patent: Jun. 7, 2016

(54) ENCAPSULATED SEMICONDUCTOR DEVICE

(71) Applicant: Infineon Technologies Austria AG, Villach (AT)

(72) Inventors: Khalil Hosseini, Weihmichl (DE); Joachim Mahler, Regensburg (DE); Ivan Nikitin, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/013,495

(22) Filed: Aug. 29, 2013

(65) Prior Publication Data

US 2015/0060872 A1    Mar. 5, 2015

(51) Int. Cl.

| | |
|---|---|
| *H01L 23/29* | (2006.01) |
| *H01L 23/28* | (2006.01) |
| *H01L 21/56* | (2006.01) |
| *H01L 23/34* | (2006.01) |
| *H01L 23/31* | (2006.01) |
| *H01L 23/495* | (2006.01) |
| *H01L 23/00* | (2006.01) |

(52) U.S. Cl.
CPC ............... *H01L 23/28* (2013.01); *H01L 21/56* (2013.01); *H01L 21/561* (2013.01); *H01L 23/3135* (2013.01); *H01L 23/34* (2013.01); *H01L 23/4951* (2013.01); *H01L 23/49524* (2013.01); *H01L 24/96* (2013.01); *H01L 21/568* (2013.01); *H01L 23/3107* (2013.01); *H01L 23/49513* (2013.01); *H01L 23/49568* (2013.01); *H01L 2224/48247* (2013.01); *H01L 2924/12032* (2013.01); *H01L 2924/12042* (2013.01); *H01L 2924/1305* (2013.01); *H01L 2924/13055* (2013.01); *H01L 2924/13091* (2013.01); *H01L 2924/15787* (2013.01)

(58) Field of Classification Search
CPC ..................... H01L 23/3135; H01L 2924/181; H01L 21/56; H01L 23/28; H01L 23/29
USPC .......................... 257/705, 706, 707, 787, 790
See application file for complete search history.

(56) References Cited

U.S. PATENT DOCUMENTS

| | | | | |
|---|---|---|---|---|
| 3,504,181 | A * | 3/1970 | Campbell et al. | 250/336.1 |
| 3,918,079 | A * | 11/1975 | Youmans | 257/522 |
| 4,472,730 | A * | 9/1984 | Ohta | 257/786 |
| 5,641,997 | A * | 6/1997 | Ohta et al. | 257/788 |
| 5,993,544 | A * | 11/1999 | Knauss et al. | 117/94 |
| 6,040,619 | A * | 3/2000 | Wang et al. | 257/649 |
| 7,612,457 | B2 | 11/2009 | Mahler et al. | |
| 7,994,646 | B2 | 8/2011 | Mahler et al. | |
| 2008/0265383 | A1 | 10/2008 | Brunnbauer et al. | |
| 2010/0078783 | A1 | 4/2010 | Otremba | |

* cited by examiner

*Primary Examiner* — S. V. Clark
(74) *Attorney, Agent, or Firm* — Murphy, Bilak & Homiller, PLLC (57) ABSTRACT

A semiconductor device includes a carrier and a semiconductor chip disposed over the carrier. The semiconductor chip has a first surface and a second surface opposite to the first surface, wherein the second surface faces the carrier. Further, the semiconductor device includes a pre-encapsulant covering at least partially the second surface of the semiconductor chip and at least partially a side wall surface of the semiconductor chip. The pre-encapsulant has a thermal conductivity of equal to or greater than 10 W/(m·K) and a specific heat capacity of equal to or greater than 0.2 J/(g·K).

14 Claims, 8 Drawing Sheets

ENCAPSULATED SEMICONDUCTOR DEVICE

TECHNICAL FIELD

This invention relates to the technique of packaging, and in particular to the technique of packaging a semiconductor chip.

BACKGROUND

Semiconductor device manufacturers are constantly striving to increase the performance of their products, while decreasing their cost of manufacture. A cost intensive area in the manufacture of semiconductor devices is packaging the semiconductor chip. Performance of a semiconductor device is dependent from the heat dissipation capability provided by the package. Packaging methods providing high thermal robustness at low expenses are desirable. Further aspects of packaging concern high insulation strength, high breakthrough strength, and chip protection.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

In the following detailed description, reference is made to the accompanying drawings, which form a part thereof, and in which is shown byway of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "connected" are not meant to mean in general that elements must be directly coupled or connected together. Intervening elements may be provided between the "coupled" or "connected" elements. However, although not restricted to that meaning, the terms "coupled" and/or "connected" may also be understood to optionally disclose an aspect in which the elements are directly coupled or connected together without intervening elements or layers provided between the "coupled" or "connected" elements.

Devices containing a semiconductor chip are described herein. In various embodiments, horizontal semiconductor chips may be involved. A semiconductor chip having a horizontal structure has electrodes only on one of its two main surfaces, that is to say on its active (or top) surface.

Further, devices containing a semiconductor chip having a vertical structure may be involved. In semiconductor chips having a vertical structure, the electric currents can flow in a direction perpendicular to the main surfaces of the semiconductor chips. A semiconductor chip having a vertical structure has electrodes on its two main surfaces, that is to say on its top side and bottom side.

The semiconductor chip may be manufactured from specific semiconductor material such as, for example, Si, SiC, SiGe, GaAs, GaN, AlGaN, InGaAs, InAlAs, etc, and, furthermore, may contain inorganic and/or organic materials that are not semiconductors.

Furthermore, the semiconductor devices described herein may optionally include one or more logic integrated circuit to control the semiconductor chip. The logic integrated circuit may include one or more driver circuits to drive the semiconductor chip. The logic integrated circuit may, e.g., be a microcontroller including, e.g., memory circuits, level shifters, etc.

The semiconductor chip may have electrodes (chip pads) which allow electrical contact to be made with the integrated circuit(s) included in the semiconductor chip. The electrodes may include one or more metal layers which are applied to the semiconductor material of the semiconductor chip. The metal layers may be manufactured with any desired geometric shape and any desired material composition. The metal layers may, for example, be in the form of a layer or land covering an area. By way of example, any desired metal capable of forming a solder bond or diffusion solder bond, for example Cu, Ni, NiSn, Au, Ag, Pt, Pd, In, Sn, and an alloy of one or more of these metals may be used as the material. The metal layers need not be homogenous or manufactured from just one material, that is to say various compositions and concentrations of the materials contained in the metal layers are possible.

The semiconductor chip may, for example, be configured as a power semiconductor chip.

The (power) semiconductor chip may, for example, be configured as a MISFET (Metal Insulator Semiconductor Field Effect Transistor), a MOSFET (Metal Oxide Semiconductor Field Effect Transistor), an IGBT (Insulated Gate Bipolar Transistor), a JFETs (Junction Gate Field Effect Transistor), a HEMT (High Electron Mobility Transistor), a power bipolar transistor or power diode such as, e.g., a PIN diode or a Schottky diode.

In particular, a HEMT semiconductor chip may, e.g., be based on GaN, GaAs, AlGaN, InGaAs, or InAlAs. The HEMT may, e.g., be used as a switching device in a voltage converter such as, e.g., an AC-DC converter or a DC-DC converter, a power amplifier, a RF-circuit, etc.

In particular, a MISFET or MOSFET semiconductor chip or a power diode semiconductor chip may be based on Si or SiC. Similar to a HEMT, in particular a SiC transistor or a SiC diode is small in size while experiencing high thermal power losses.

The semiconductor chip may at least partly be surrounded or embedded in a pre-encapsulating material. The pre-encapsulating material may at least cover a part or all of the bottom surface of the semiconductor chip and at least a part or all of a side wall surface of the semiconductor chip. The pre-encapsulating material may comprise or be made of a ceramics, in particular a non-oxide ceramics, or a metal, or a metal alloy, or a compound of two or more of a ceramics, a metal, and a metal alloy. By way of example, the pre-encapsulating material may comprise, e.g., a multi-layer structure comprising at least one layer made of a ceramic and one layer made of a metal or a metal alloy.

The pre-encapsulant material (if a multi-layer structure is considered, the pre-encapsulating material of any or all layers thereof) may have a high thermal conductivity and/or a high specific heat capacity to allow for effective static heat dissipation and/or effective dynamic heat dissipation, respectively, of the thermal power loss of the semiconductor chip. Effective static heat dissipation and/or effective dynamic heat dissipation is of particular importance if the semiconductor chip has a high thermal power loss areal density, such as, e.g., a HEMT or a MISFET/MOSFET made, e.g., on the basis of GaN, SiC, etc.

The pre-encapsulated semiconductor chip may at least partly be surrounded or embedded in at least one electrically insulating material. The electrically insulating material may form an encapsulation body. The encapsulation body may form part of the periphery of the package, i.e. may at least partly define the (outer) shape of the semiconductor device.

The encapsulation body may comprise or be made of, e.g., a mold material or a laminate material. In the first case, various techniques may be employed to form the encapsulation body of the insulating material, for example compression molding, injection molding, powder molding or liquid molding. Further, e.g. in the second case, the encapsulation body may have the shape of a piece of a layer, e.g. a piece of a sheet or foil that is laminated on top of the semiconductor chip and over a device carrier on which the semiconductor chip is mounted.

The semiconductor chip, after being pre-encapsulated, may be mounted over a device carrier. The device carrier may, e.g., be an electrically conducting carrier, by way of example a metal plate or metal sheet such as, e.g., a die pad of a leadframe. The metal plate or metal sheet may be made of any metal or metal alloy, e.g. copper or copper alloy. In other embodiments, the device carrier may comprise or be made of plastics or ceramics. For instance, the device carrier may comprise a layer of plastics coated with a metal layer. By way of example, such chip carrier may be a single-layer PCB (Printed circuit board) or a multi-layer PCB. In other embodiments, the device carrier may comprise a plate of ceramics coated with a metal layer, e.g. a metal bonded ceramics substrate. In particular, the device carrier may be a DCB (direct copper bonded) ceramics substrate.

The electrically insulating material forming the encapsulation body may comprise or be made of a thermoset material or a thermoplastic material. A thermoset material may, e.g., be made on the basis of an epoxy resin, a silicone resin or an aryclic resin. A thermoplastic material may, e.g., comprise one or more materials selected from the group of polyetherimide (PEI), polyether-sulfone (PES) polyphenylene-sulfide (PPS) and polyamide-imide (PAI), polyethylene-terephthalat (PET). Thermoplastic materials melt by application of pressure and heat during molding or lamination and (reversibly) harden upon cooling and pressure release.

The electrically insulating material forming the encapsulation body may comprise or be made of a polymer material. The electrically insulating material may comprise at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

In various embodiments, the electrically insulating material may be a laminate, e.g. a polymer foil or sheet. Heat and pressure may be applied for a time suitable to attach the polymer foil or sheet to the underlying structure. During lamination, the electrically insulating foil or sheet is capable of flowing (i.e. is in a plastic state), resulting in that gaps between the semiconductor chips and/or other topological structures on the device carrier are filled with the polymer material of the electrically insulating foil or sheet. The electrically insulating foil or sheet may comprise or be made of any appropriate thermoplastic or thermoset material. In one embodiment, the insulating foil or sheet may comprise or be made of a prepreg (short for pre-impregnated fibers), that is e.g. made of a combination of a fiber mat, for example glass or carbon fibers, and a resin, for example a thermoset or thermoplastic material. Prepreg materials are known in the art and are typically used to manufacture PCBs (printed circuit boards).

A connection element may be electrically and mechanically connected to a load electrode of the semiconductor chip which is arranged at a semiconductor chip surface opposite to the surface which faces the device carrier. The connection element may, e.g., be implemented by a (plurality of) bonding wire(s), a (plurality of) contact clip(s), a (plurality of) ribbon(s), a galvanically deposited metal wire, etc.

In general, any semiconductor device comprising a semiconductor chip having, e.g., a high thermal power loss and a comparatively small footprint area to dissipate the thermal power may benefit from the disclosure herein. By way of example, semiconductor chips having, in operation, a thermal power loss of equal to or greater than, e.g., 3.0 W, 5.0 W, 7.0 W, or 9.0 W and, e.g., a footprint area for thermal power dissipation equal to or less than 15 mm$^2$, 10 mm$^2$, 7 mm$^2$, 5 mm$^2$, or 3 mm$^2$ may, e.g., use a pre-encapsulating material as described herein for improving thermal behavior and power dissipation during operation.

A variety of different types of electronic devices may use one or more semiconductor devices as described herein. By way of example, an electronic device in accordance with the disclosure may constitute, e.g., a power supply, a DC-DC voltage converter, an AC-DC voltage converter, a power amplifier, and many other power devices.

Figure 1A:
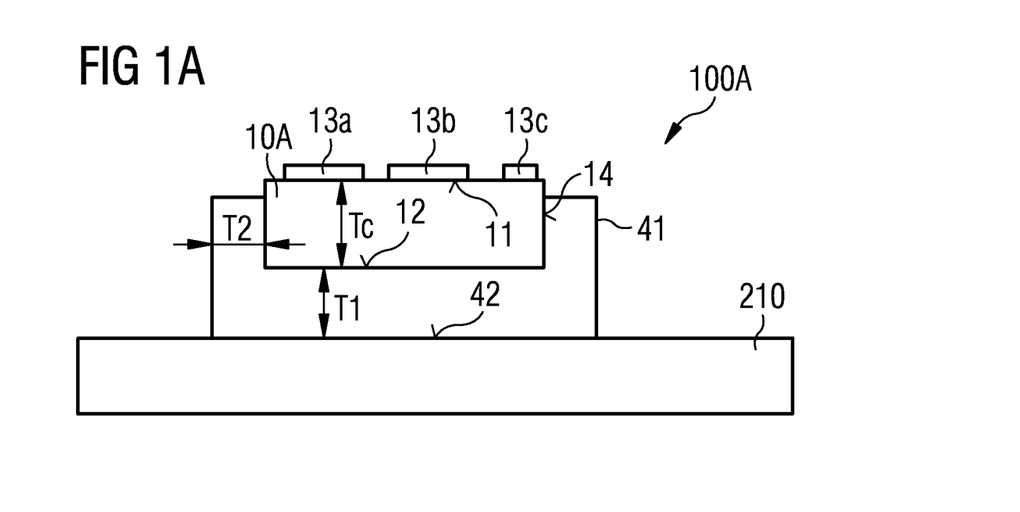
FIGS. 1A-1B schematically illustrate cross-sectional views of exemplary semiconductor devices comprising a pre-encapsulated semiconductor chip.
Figure 1B:
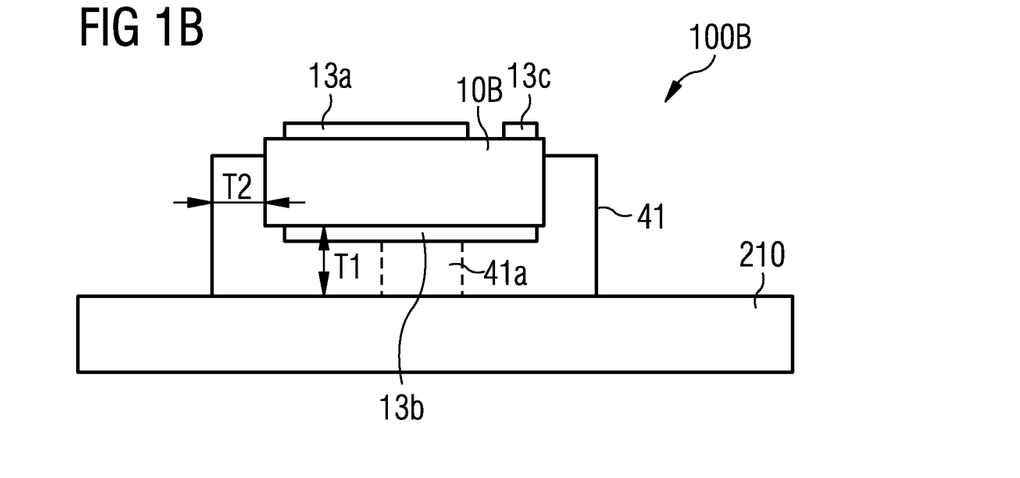

FIGS. 1A and 1B illustrate cross-sectional views of exemplary semiconductor devices 100A, 100B comprising pre-encapsulated semiconductor chips 10A and 10B, respectively. According to FIG. 1A, the semiconductor chip 10A may have a first surface (top surface) 11 and a second surface (bottom surface) 12 opposite to the first surface 11. Here, the semiconductor chip 10A is a horizontal device, the first surface 11 is an active surface and the second surface 12 is a non-active surface 12. The first surface 11 may, e.g., comprise all of the electrodes 13a, 13b, 13c of the semiconductor chip 10A, while the second surface 12 may be void of any electrodes. The electrodes 13a, 13b, 13c may be configured to provide electrical contact to an integrated circuit implemented within the semiconductor chip 10A. By way of example, electrode 13a may be a source electrode, electrode 13b may be a drain electrode and electrode 13c may be a gate electrode of a transistor implemented in the semiconductor chip 10A. The gate electrode 13c may, e.g., also be located between the source electrode 13a and the drain electrode 13b. The semiconductor chip 10A may, e.g., be a high electron mobility device such as, e.g., a HEMT. Further, the semiconductor chip 10A may, e.g., be a two electrode device such as, e.g., a diode. In this case, the semiconductor chip 10A comprises two electrodes, i.e. an anode and a cathode. Byway of example, the anode may correspond to electrode 13a and the cathode may correspond to electrode 13b.

The semiconductor chip 10A may be a power semiconductor chip having a high thermal power loss and a comparatively small footprint area to dissipate the thermal power generated in the semiconductor chip as mentioned above. The semiconductor chip 10A may be configured to operate at voltages greater than 50 V, 100 V, 300 V, 500 V, or 800 V. Further, the semiconductor chip 10A may be made on the basis of, e.g., GaN, SiGe, GaAs, AlGaN, InGaAs, InAlAs, or SiC.

The semiconductor chip 10A may have a thickness Tc measured between the first surface 11 and the second surface 12 of equal to or less than 300 µm, 200 µm, 100 µm, 80 µm, or 50 µm.

A pre-encapsulant 41 covers at least partially the second (bottom) surface 12 of the semiconductor chip 10A and at least partially a side wall surface 14 of the semiconductor chip 10A. In particular, the pre-encapsulant 41 may predominantly (i.e. more than 50% of surface area) or completely cover the side wall surface 14 of the semiconductor chip 10A. The first (top) surface 11 of the semiconductor chip 10A may e.g. be free of pre-encapsulant 41. The pre-encapsulant 41 may have a thermal conductivity of equal to or greater than 10 W/(m·K) and a specific heat capacity of equal to or greater than 0.2 J/(g·K). As will be described in more detail further below, the pre-encapsulant 41 may, e.g., comprise or be made of ceramics material or metal material or a composite material, e.g. a multi-layer structure of ceramics and metal. The pre-encapsulant 41 may further provide a chip protection for increased reliability, e.g., against environmental or chemical impact or in view of high insulation strength and break-through strength. By way of example, the pre-encapsulant 41 may hermetically seal the second (bottom) surface 12 of the semiconductor chip 10A and, partially or completely, the side wall surface 14 of the semiconductor chip 10A.

By way of example, T2, i.e. the layer thickness of the pre-encapsulant 41 over the side wall surface 14 of the semiconductor chip 10A may be equal to or greater than 20 µm, 50 µm, 80 µm, 100 µm, 150 µm, 200 µm, or 250 µm. Further, the thickness T1, i.e. the layer thickness of the pre-encapsulant 41 over the second surface 12 of the semiconductor chip 10A may be equal to or greater than 20 µm, 50 µm, 80 µm, 100 µm, 150 µm, 200 µm, or 250 µm. Thickness T1 is measured between the second surface 12 of the semiconductor chip 10A and a surface 42 of the pre-encapsulant 41 facing away from the semiconductor chip 10A. The thickness T1 may be constant over the first surface 12 of the semiconductor chip 10A.

By way of example, the pre-encapsulated semiconductor chip 10A may be mounted on a carrier 210 with the surface 42 of the pre-encapsulant 41 facing the carrier 210. The carrier 210 may be made of a flat metal plate, e.g., a die pad of a leadframe. By way of example, the carrier 210 may be made of a bulk metal material. It is also possible that the carrier 210 is made of a PCB or a metal bonded ceramic substrate. The carrier 210 may be electrically conducting or electrically non-conducting.

According to FIG. 1B, the semiconductor chip 10B may be a vertical device, i.e. the first or top surface 11 comprises one or more electrodes 13a, 13c and the second or bottom surface 12 also comprises one or more electrodes 13b. Again, the electrodes 13a, 13b, 13c may be configured to provide electrical contact to an integrated circuit implemented within the semiconductor chip 10B. By way of example, electrode 13a may be a source electrode, electrode 13b may be a drain electrode and electrode 13c may be a gate electrode of a transistor implemented in the semiconductor chip 10B.

As a difference to exemplary semiconductor device 100A, the pre-encapsulant 41 of exemplary semiconductor device 100B may comprise an electrical feed-through 41a configured to electrically connect the electrode 13b located at the second (bottom) surface of the semiconductor chip 10B with the carrier 210. The electrical feed-through 41a may be designed as a through hole passing through the pre-encapsulant 41 and being filled with an electrically conducting substance, e.g., metal, solder, conductive polymer, etc. Apart from these differences (vertical chip 10B, electrode 13b provided at second chip surface 12, optionally feed-through 41a), all features of semiconductor device 100B may be identical to the corresponding features of exemplary semiconductor device 100A and reference is made to the above description to avoid reiteration. In particular, this applies to the types and materials of semiconductor chip 10B, the operating voltages, dimensions of semiconductor chip 10B, materials, dimensions and thermal properties of the pre-encapsulant 41 and the implementation of the carrier 210.

FIGS. 2A-2E illustrate stages of an exemplary process of manufacturing a pre-encapsulated semiconductor chip 100. By way of example, the pre-encapsulated semiconductor chip 100 produced in FIGS. 2A-2E contains a horizontal semiconductor chip 10A as described above. However, a similar process could be used to manufacturing a pre-encapsulated semiconductor chip 100 comprising a vertical semiconductor chip 10B.

Figure 2A:
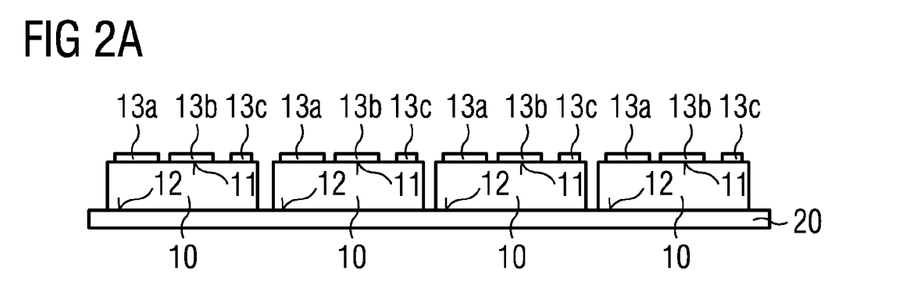
FIGS. 2A-2G schematically illustrate cross-sectional views of an exemplary process of manufacturing a semiconductor device comprising a pre-encapsulated semiconductor chip.
Figure 2B:
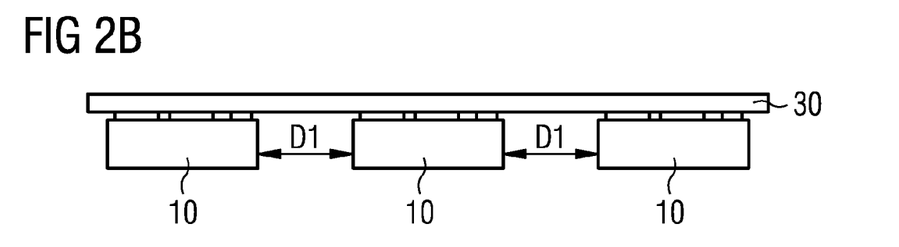

According to FIG. 2A, semiconductor chips 10 (e.g. semiconductor chips 10A or 10B) may be provided by dicing a semiconductor wafer into single semiconductor chips 10. The semiconductor chips 10 may each have a first surface 11 and a second surface 12 opposite to the first surface 11 as explained above. That is, the first surface 11 may, e.g., comprise all of the electrodes 13a, 13b, 13c of the semiconductor chip 10.

The semiconductor chips 10 are illustrated to be placed on a dicing tape 20 after being diced. The semiconductor chips 10 may then be released from the dicing tape 20 and placed on or attached to a temporary carrier 30, see FIG. 2B. The temporary carrier 30 faces the first surface 11 of each of the semiconductor chips 10. The temporary carrier 30 may be equipped with a sticking tape (not shown) or an adhesive to hold the semiconductor chips 10 in place. The semiconductor chips 10 are placed on the temporary carrier 30 in a spaced apart relationship. That is, a free spaces of distance D1 are provided between adjacent semiconductor chips 10. The distance D1 may be chosen based on the desired design parameters (i.e. wall thickness T2) of the pre-encapsulated semiconductor chip 100 to be produced. In particular, the distance D1 may be greater than the distance between adjacent semiconductor chips 10 on the dicing tape 20.

Figure 2C:
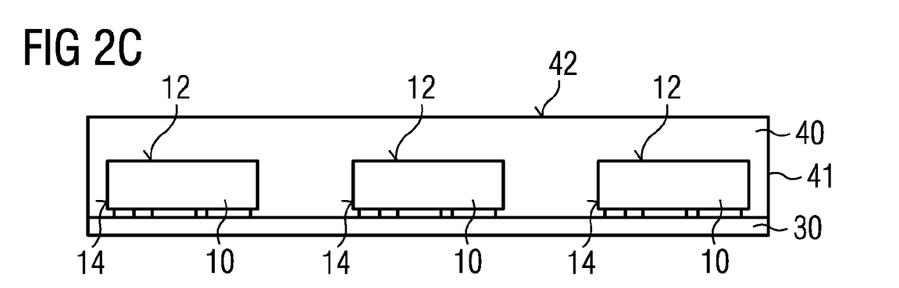

Referring to FIG. 2C, a pre-encapsulation material 40 is deposited over the second surfaces 12 of the semiconductor chips 10. The pre-encapsulation material 40 may also be deposited over portions of the temporary carrier 30 which are not covered by the semiconductor chips 10. Thus, the pre-encapsulation material 40 may partly or completely fill the free spaces between the semiconductor chips 10.

The pre-encapsulation material used for covering the semiconductor chips 10 may comprise or be made of ceramics or a metal or a composition thereof, e.g. a multi-layer structure of ceramics and metal. The pre-encapsulation material 40 forms a pre-encapsulant 41 which partly or completely covers the second surfaces 12 of the semiconductor chips 10 and which may partly or completely cover the side wall surfaces 14 of the semiconductor chips 10.

The pre-encapsulant 41 may have an outer surface 42 which completely covers the semiconductor chips 10. The surface 42 may, e.g., be planar. A planar surface 42 of the encapsulant 41 may, e.g., be obtained by applying planarization methods such as, e.g., grinding, or by using a pre-encapsulation material 40 deposition process which provides for a planar surface 42.

The pre-encapsulation material 40 may, e.g., be deposited by CVD (Chemical Vapor Deposition) or by PVD (Physical Vapor Deposition), in particular by sputtering, thermal evaporation, laser deposition, cathodic arc deposition, galvanic or electroless plating, a plasma beam deposition, or by a sol-gel process. By way of example, if a plasma beam deposition process is used, a plasma generator is moved over the semiconductor chips 10 and the temporary carrier 30. The plasma generator (not shown) may discharge a plasma beam, which is directed to one or more semiconductor chips 10, and the free spaces between the semiconductor chips 10. In order to achieve a sufficient thickness of the pre-encapsulation material 40 over the semiconductor chips and/or over the temporary carrier 30, the plasma generator (not shown) may perform several sweeping movements in a transversal direction. That is, the surfaces to be coated with pre-encapsulation material 40 may be exposed to the plasma beam for several times. Plasma beam deposition methods, as well as other methods mentioned herein, may provide for low process temperatures, e.g. equal to or less than 250° C. or 220° C., and for a layer thickness of the pre-encapsulation material over the semiconductor chips 10 of equal to or greater than 20 µm, 50 µm, 80 µm, 100 µm, 150 µm, 200 µm, or 250 µm. It is to be noted that both ceramics and metal pre-encapsulation materials 40 may be deposited by using the plasma beam deposition method described above.

Other processes for applying the pre-encapsulation material 40 such as, e.g., molding processes may also be possible. Further, if a ceramics material is used for the pre-encapsulant 41, the porosity of the ceramics may be set to a desired value by controlling process parameters. By way of example, a porosity of equal to or less than 50%, 30%, 20%, 10%, or 5% may be obtained.

Figure 2D:
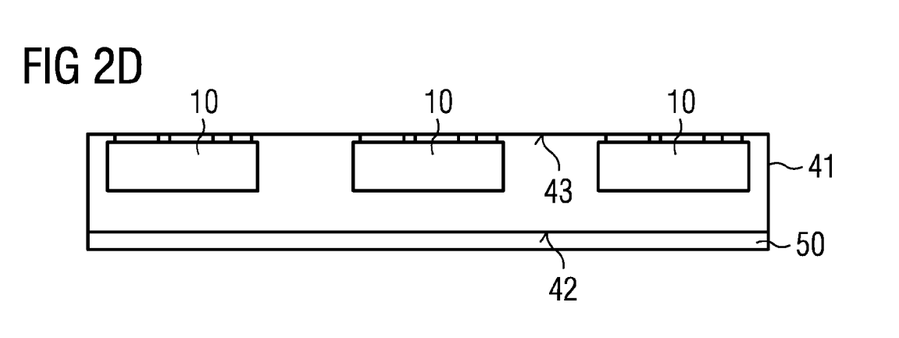

Referring to FIG. 2D, the pre-encapsulant 41 may then be turned-over and placed on a dicing tape 50 with the surface 42 of the pre-encapsulant 41 facing the dicing tape 50. Further, the temporary carrier 30 may be removed. After removing the temporary carrier 30, the electrodes 13a, 13b, 13c, of the semiconductor chips 10 may be exposed. Further, the electrodes 13a, 13b, 13c of the semiconductor chips 10 may be coplanar with each other and may be coplanar with an upper surface 43 of the pre-encapsulant 41.

Figure 2E:
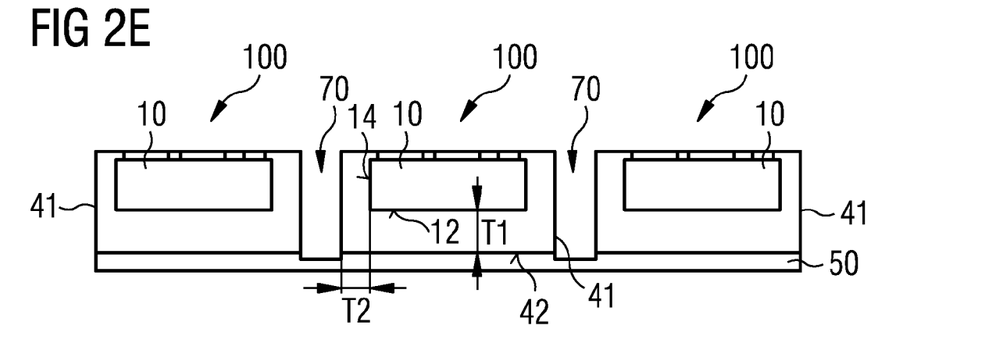

Referring to FIG. 2E, the pre-encapsulated semiconductor chips 100 may then be singulated. Singulation may be performed by using a dicing technique such as, e.g., blade dicing (sawing), laser dicing, etching, plasma etching, etc. Multi-step dicing using different dicing techniques is also possible. The dicing technique may depend on the pre-encapsulation material(s) 40 used for forming the pre-encapsulant 41.

The pre-encapsulated semiconductor chips 100 may be singulated along dicing streets 70 between the pre-encapsulated semiconductor chips 100. The dicing streets 70 may be arranged in rows and columns which cross each other in order to generate single pre-encapsulated semiconductor chips 100. Further, the wall thickness T2 measured between the side wall surface 14 of a semiconductor chip 10 and the peripheral side wall surface of a pre-encapsulated semiconductor chip 100 may be controlled or defined by the dicing process.

FIGS. 2A-2E illustrate by, way of example, a method in which a plurality of pre-encapsulated semiconductor chips 100 are manufactured in parallel on wafer level. Such processing on wafer level is referred to as eWLP (embedded wafer level package). However, different to conventional eWLP, the pre-encapsulation material 40 may not be a plastic material.

More specifically, the pre-encapsulant 41, if made of one or more materials, may have a thermal conductivity of equal to or greater than 10, 20, 40, 80, 100, or 150 W/(m·K). Further, the pre-encapsulant 41 may have a specific heat capacity of equal to or greater than 0.2, 0.4, 0.5, or 0.7 J/(g·K).

By way of example, the pre-encapsulant 41 may comprise ceramic material(s), in particular non-oxide ceramic material(s) such as, e.g. silicon nitride, boron carbide, boron nitride, silicon carbide, aluminum nitride, etc. Silicon nitride has a thermal conductivity in a range between 10-35 W/(m·K), boron carbide as a thermal conductivity of about 50 W/(m·K), boron nitride has a thermal conductivity of about 50 W(m·K), silicon carbide has a thermal conductivity in the range between about 100 and 110 W/(m·K) and aluminum nitride has a thermal conductivity of about 180 W/(m·K). All these non-oxide ceramic materials have a specific heat capacity in the range between about 0.5 and 1.0 J/(g·K).

As will be set out in more detail in conjunction with FIGS. 5A-5C and FIGS. 7A-7B, the pre-encapsulant 41 may comprise metal material(s) such as, e.g., copper, silver, aluminum, steel, etc., including alloys of metal materials. The thermal conductivity of copper is about 400 W/(m·K), the thermal conductivity of silver is about 430 W/(m·K), and the thermal conductivity of aluminum is about 235 W/(m·K). The specific heat capacity of copper is about 0.4 J/(g·K), the specific heat capacity of silver is about 0.25 J/(g·K), and the specific thermal capacity of aluminum is about 0.9 J/(g·K). These figures compared to the low thermal conductivity of plastics, which is less than 0.5 W/(m·K), and to the specific heat capacity of plastics in a range between 1 and 2.5 J/(g·K).

It is to be noted that the pre-encapsulated semiconductor chip 100 may also be manufactured by methods which are different to the example method as illustrated in FIGS. 1A-1E. By way of example, no eWLP process must be used. It is possible that for each pre-encapsulated semiconductor chip 100, the pre-encapsulant 41 covering partly or completely the second surface 12 of the semiconductor chip 10 is formed separately, without the need of a dicing or structuring step as illustrated in FIG. 2E. Thus, the disclosure herein is not limited to the example eWLP process of FIGS. 2A-2E to apply the pre-encapsulant 41 to the semiconductor chip 10 to obtain the pre-encapsulated semiconductor chip 100, and features described above are also applicable to the pre-encapsulated semiconductor chip 100 (e.g. 100A, 100B) when fabricated by other methods.

Figure 2F:
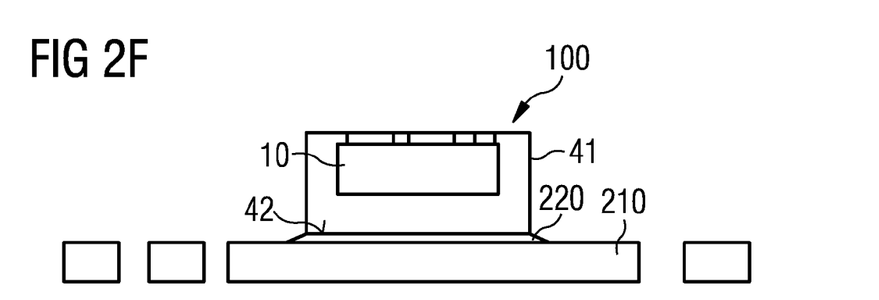
Figure 2G:
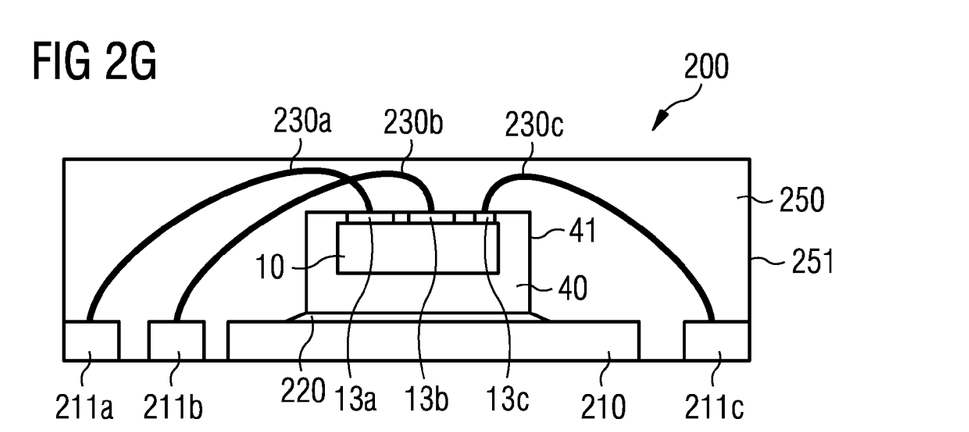

FIGS. 2F-2G illustrate an exemplary process to manufacture a semiconductor device 200 including the pre-encapsulated semiconductor chip 100. The semiconductor device 200 corresponds to semiconductor device 100A, with more details are shown. Referring to FIG. 2F, the pre-encapsulated semiconductor chip 100 may be disposed over the carrier 210. A bonding layer 220 may be arranged between the surface 42 of the pre-encapsulant 41 and the carrier 210. The bonding layer 220 may be configured to mechanically fix the pre-encapsulated semiconductor chip 100 to the carrier 210. If the pre-encapsulated semiconductor chip 100B comprising the vertical semiconductor chip 10B would be used as pre-encapsulated semiconductor chip 100, the bonding layer 220 may further be configured to electrically connect the semiconductor chip 10B to the carrier 210.

The bonding layer 220 may, e.g., have a high thermal conductivity and/or small thickness. By way of example, the thickness of the bonding layer 220 may, e.g., be equal to or less than 50 µm, 20 µm, 5 µm, or 2 µm. The smaller the thickness the better is the heat transport through the bonding layer 220.

The bonding layer 220 may, e.g., be an adhesive layer. By way of example, such adhesive layer may be filled by metal particles, e.g., Ag, Cu, etc. particles to increase the thermal conductivity or to generate electrical conductivity. By way of example, if surface 42 is a ceramic surface, an adhesive layer may be used. As will be explained in more detail further below, if the surface 42 is e.g. a metal surface, the bonding layer 220 may, e.g., be a solder bond layer, e.g. a soft or hard solder bond layer or, in particular, a diffusion solder bond layer. Such solder bonding layers 220 may, e.g., be made of AuSn, AgSn, CuSn, AgIn, AuIn, AuGe, CuIn, AuSi, Sn, Zn or Au.

Referring to FIG. 2G, the electrodes 13a, 13b, 13c of the semiconductor chip 10 may be electrically connected to contact pads 211a, 211b, 211c of the semiconductor device 200. The contact pads 211a, 211b, 211c may form external terminals of the semiconductor device 200. Thus, the lower surfaces of the contact pads 211a, 211b, 211c may be configured to be connected to an application board (not shown) to which the semiconductor device 200 is to be mounted. By way of example, the contact pads 211a, 211b, 211c may form part of a leadframe of which the carrier 210 is the die pad. The contact pads 211a, 211b, 211c may be leads of a leadframe used as external terminals of a leaded package or may be external contact terminals of a leadframe used in a leadless package.

By way of example, the contact pads 211a, 211b, 211c may be electrically connected to the electrodes 13a, 13b, 13c by wire bonds 230a, 230b, 230c, respectively. However, electrical connections of other types such as, e.g., ribbons, clips, strips, etc. may be used to interconnect the electrodes 13a, 13b, 13c to external terminals of the semiconductor device 200. Another electrical interconnect using deposited wires is described further below with respect to FIGS. 9A-9C.

Further referring to FIG. 2G, an electrically insulating material 250, e.g. a mold material or a laminate, may be applied to form an encapsulation body 251. The encapsulation body 251 may partly or completely embed the wire bonds 230a, 230b, 230c (or the electrical connection elements of other type), the pre-encapsulated semiconductor chip 100 and, e.g., the bonding layer 220. Typically, the thermal conductivity of the electrically insulating material 250 is significantly smaller than the thermal conductivity of the pre-encapsulation material 40.

The thermal power generated in the semiconductor chip 10 during operation must be drained in order to avoid overheating, degradation or breakdown of the semiconductor chip 10. The pre-encapsulant 41 provides for a high stationary thermal power dissipation and a high dynamic thermal power dissipation.

Stationary thermal power dissipation relates to the average thermal power produced in the semiconductor chip 10. This thermal power is produced more or less continuously in the semiconductor chip 10 and, therefore, has to be continuously conducted away from the semiconductor chip 10. As the pre-encapsulant 41 provides a high thermal conductivity, the pre-encapsulant 41 together with the bonding layer 220 and the carrier 210 allow for continuous and efficient heat removal.

Dynamic thermal power dissipation relates to fluctuations in the generation of thermal power in the semiconductor chip 10. Typically, in many applications, the thermal power generated in the semiconductor chip 10 is time-variant. Time-variance may, e.g., be caused by the time-variant operation of the semiconductor chip 10 or a time-variant operation of a load connected thereto or both.

Dynamic thermal power dissipation is combated by the heat capacity of the pre-encapsulant 41, which is tightly coupled to the semiconductor chip 10. The heat capacity of the pre-encapsulant 41 provides for a short-time heat storage facility. The storage of heat from dynamic dissipation in the pre-encapsulant 41 provides for a temporary cooling of the semiconductor chip 10. In other words, the pre-encapsulant 41 adds an effective heat capacity to the heat capacity of the semiconductor chip 10 which prevents power loss peaks to temporarily overheat the semiconductor chip 10. The greater the specific heat capacity of the pre-encapsulation material 40, the greater is the (total) heat capacity of the pre-encapsulant 41 for a given configuration (e.g. mass, dimensions of the pre-encapsulant 41.

Figure 3A:
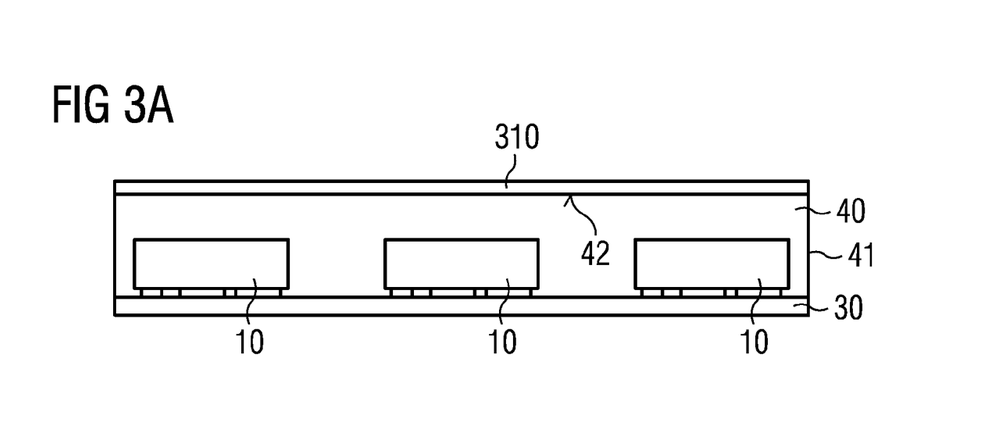
FIGS. 3A-3C schematically illustrate cross-sectional views of an exemplary process of a method of manufacturing a pre-encapsulated semiconductor chip.
Figure 3B:
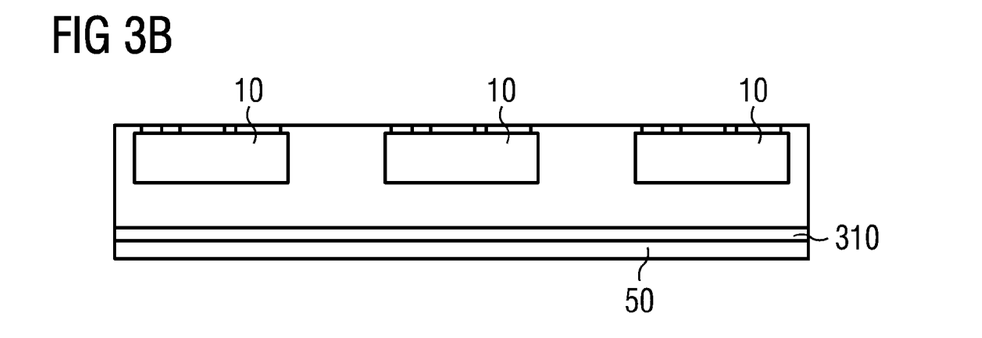
Figure 3C:
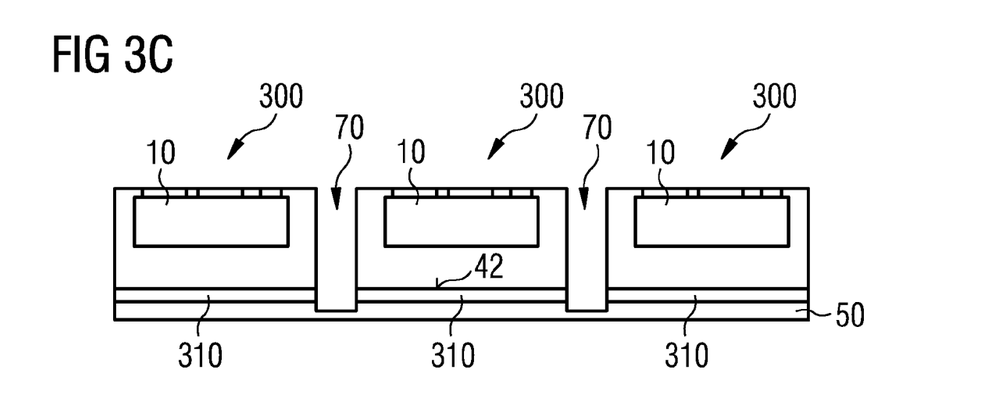

FIGS. 3A-3C illustrate an exemplary process to manufacture a pre-encapsulated semiconductor chip 300. Starting from an arrangement as shown in FIG. 2C, a metallization 310 is formed on the surface 42 of the pre-encapsulant 41, see FIG. 3A. The metallization 310 may be generated by appropriate techniques, such as, e.g., CVD, PVD, in particular sputtering. By way of example, the pre-encapsulation material 40 may be a ceramic material and the metallization 310 may be applied directly onto the ceramic material 40 by appropriate deposition techniques, e.g. sputtering, etc.

FIG. 3B illustrates placing the pre-encapsulant 41 onto a dicing tape 50 with the metallization 310 facing the dicing tape 50. Reference is made to the description of FIG. 2D to avoid reiteration.

FIG. 3C illustrates dicing the pre-encapsulant 41 and the metallization 310 to obtain the pre-encapsulated semiconductor chips 300. Each pre-encapsulated semiconductor chip 300 is provided with a metallization layer 310 which may partly or completely cover the surface 42 of the pre-encapsulated semiconductor chip 300. In order to avoid reiteration, reference is made to the description of FIG. 2E.

Figure 4:
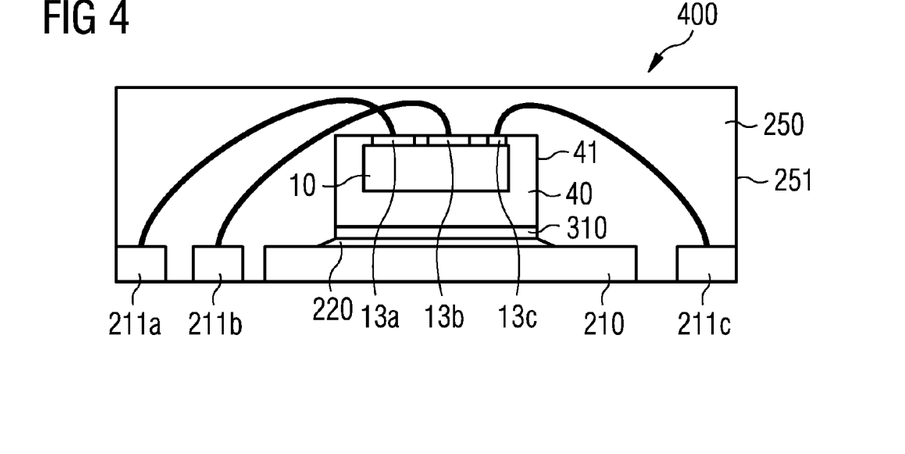
FIG. 4 schematically illustrates a cross-sectional view of an exemplary semiconductor device comprising a pre-encapsulated semiconductor chip.

FIG. 4 illustrates a semiconductor device 400. Semiconductor device 400 may be identical to semiconductor device 300 with the exception that the metallization layer 310 is arranged between the surface 42 of the pre-encapsulant 41 and the bonding layer 220. In this case, the bonding layer 220 may, e.g., be formed by a solder bond (soft-solder bond, hard-solder bond, diffusion solder bond, etc.) as described above. In particular, the thickness of the bonding layer 220 may then be reduced to a thickness as small as equal to or less than e.g. 15 µm, 10 µm, 5 µm, or 2 µm. This improves the thermal conductivity between the pre-encapsulant 41 and the carrier 210. In view of further disclosure of semiconductor device 400, reference is made to the corresponding description of semiconductor devices 100A, 100B, 200. In particular, the semiconductor device 400 could also employ a vertical semiconductor chip 10B in accordance with semiconductor device 100B. In this case, an electrical feed-through 41a could electrically connect the electrode 13b located at the second (bottom) surface of the semiconductor chip 10B with the metallization layer 310.

Figure 5A:
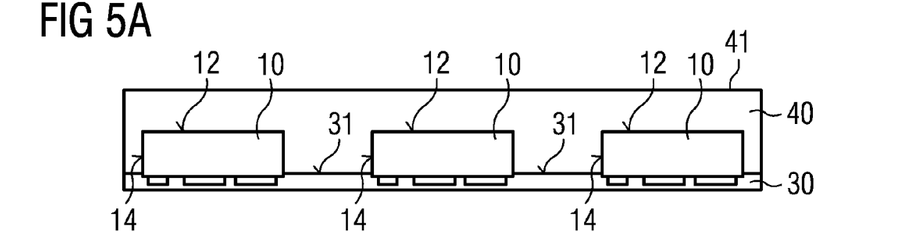
FIGS. 5A-5C schematically illustrate cross-sectional views of an exemplary process of a method of manufacturing a pre-encapsulated semiconductor chip.
Figure 5B:
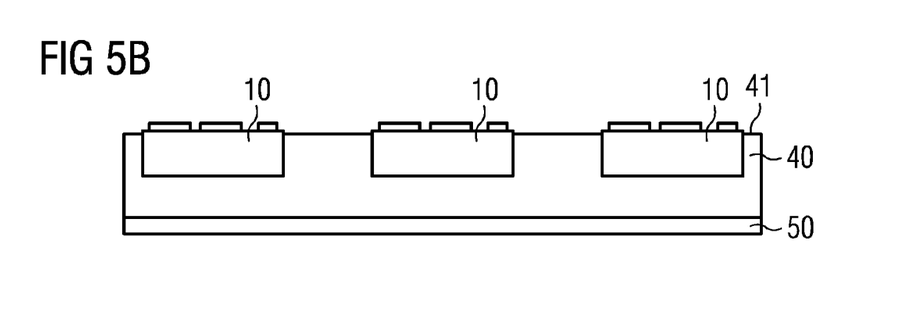
Figure 5C:
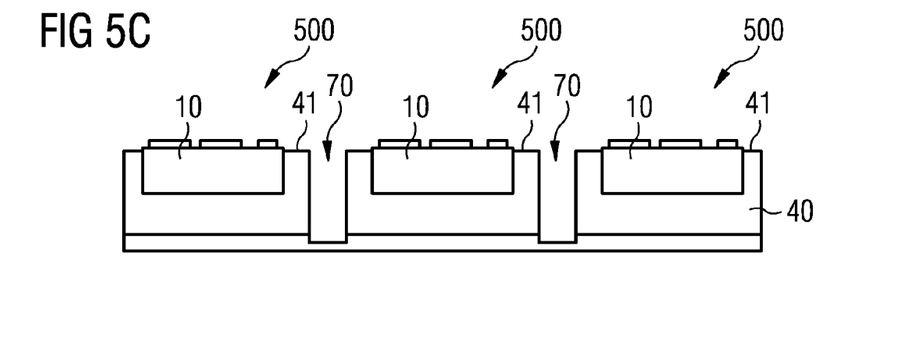

FIGS. 5A-5C illustrate, by way of example, a further process of manufacturing a pre-encapsulated semiconductor chip 500. Similar to FIG. 2C a plurality of semiconductor chips 10 is placed on a temporary carrier 30. Different to FIG. 2C the electrodes 13a, 13b, 13c may be protected, e.g. hermetically sealed by the material of the temporary carrier 30. This may, e.g., be achieved by pressing the semiconductor chips 10 into the upper surface 31 of the (soft) temporary carrier 30. The first surface 11 of the semiconductor chip 10 may dip into the upper surface 31 of the temporary carrier 30.

Then, as already explained in conjunction with FIG. 2C, the pre-encapsulation material 40 may be applied to form the pre-encapsulant 41. In particular, the pre-encapsulation material 40 may be an electrically conducting material such as, e.g., a metal, a metal alloy, etc. The electrodes 13a, 13b, 13c are protected by the temporary carrier 30 against getting in contact with the electrically conducting pre-encapsulation material 40. Further, the side wall surface 14 of the semiconductor chip 10 and, e.g., the second surface 12 of the semiconductor chip 10 may be coated by a dielectric layer (not shown) to electrically insulate the semiconductor chip 10 against the pre-encapsulation metal material 40.

The metal pre-encapsulation material 40 may be applied by a plasma beam deposition process as described before. Further, metal plating processes such as, e.g., galvanic deposition of metal may be used.

By way of example, if a galvanic plating process is used, a seed layer (not shown) may be deposited onto the second (e.g. non-active) surface 12 of the semiconductor chip 10 and over the upper surface 31 of the temporary carrier 30. The seed layer may have a thickness of e.g. 1 µm or less and may, for example, be made of zinc. Then, the seed layer is employed as an electrode, and copper or other metals or metal alloys may be plated onto the seed layer to the desired height. Further, other metal plating processes such as, e.g., electroless plating may be used to generate the pre-encapsulant 41 made of a metal pre-encapsulation material 40.

FIGS. 5B and 5C illustrate placing the pre-encapsulant 41 onto the dicing tape 50 and singulating the pre-encapsulant 41 into single pre-encapsulated semiconductor chips 500. Reference is made to the corresponding description above in order to avoid reiteration. In particular, when a metal pre-encapsulation material 40 is used, etching techniques may be used to singulate the pre-encapsulated semiconductor chips 500. Further, vertical semiconductor chips 10B may be used as explained before. Here, as the pre-encapsulation material 40 may comprise or be made of metal, no feed-through 41a is needed.

Figure 6:
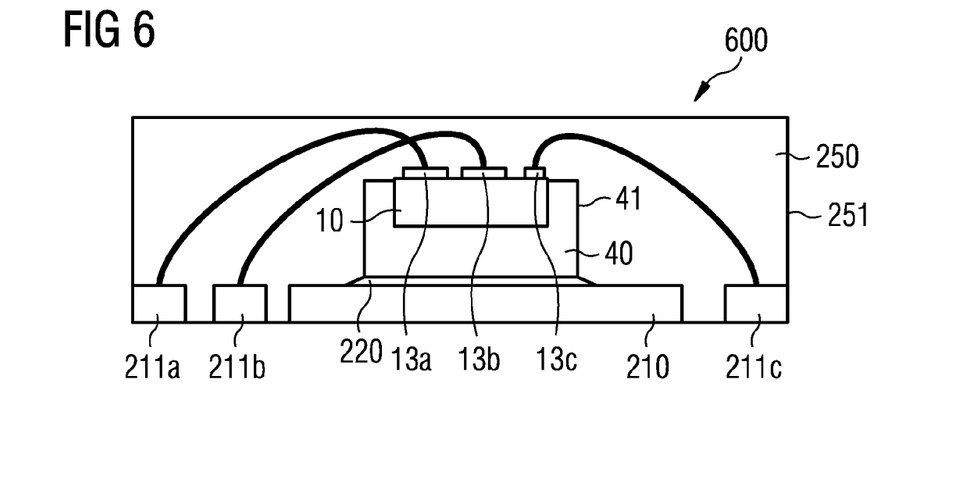
FIG. 6 schematically illustrates a cross-sectional view of an exemplary semiconductor device comprising a pre-encapsulated semiconductor chip.

FIG. 6 illustrates a semiconductor device 600 containing the pre-encapsulated semiconductor chip 500. As the pre-encapsulation material 40 may comprise or be made of metal, the bonding layer 220 may directly contact both the surface 42 of the pre-encapsulant 41 and the carrier 210. Again, a bonding layer 220 implemented by a solder bond (hard-solder bond, soft-solder bond, diffusion solder bond, etc.) may be used and the thickness of the bonding layer 220 may be as small as mentioned above. In view of semiconductor device 600, reference is made to the description above in order to avoid reiteration.

Figure 7A:
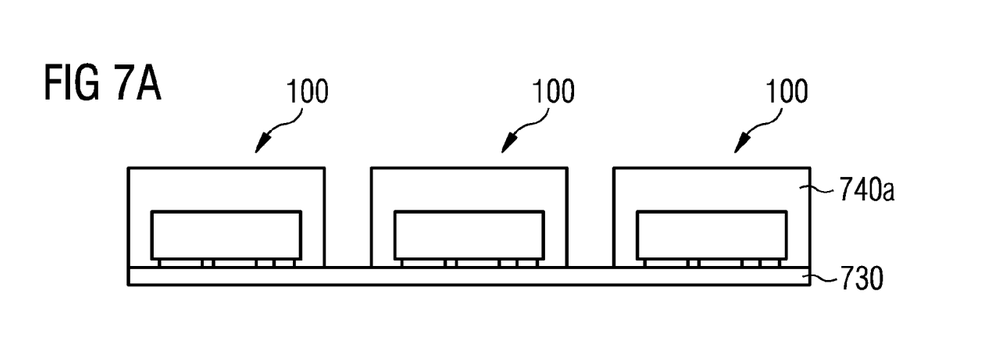
FIGS. 7A-7B schematically illustrate cross-sectional views of an exemplary process of a method of manufacturing a pre-encapsulated semiconductor chip.
Figure 7B:
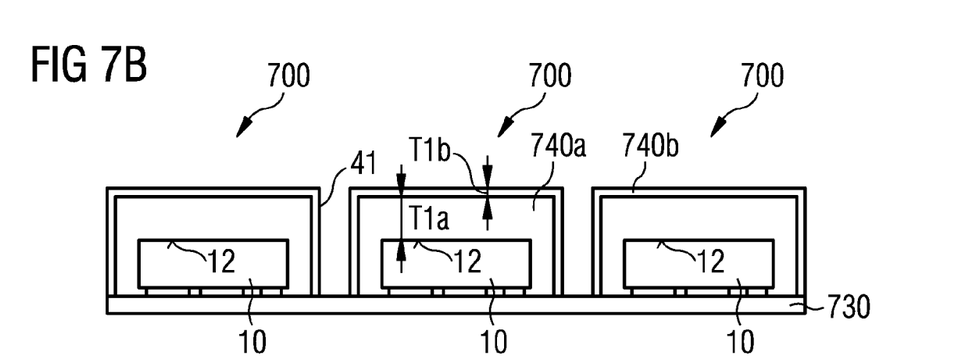

FIGS. 7A-7B illustrate, by way of example, a method of manufacturing a pre-encapsulated semiconductor chip 700. The pre-encapsulant 41 may comprise a multi-layer structure comprising at least two layers, a first layer of a first pre-encapsulation material 740a and a second layer of a second pre-encapsulation material 740b.

By way of example, the first pre-encapsulation material 740a may be a ceramic material, e.g., a non-organic ceramic material as mentioned above. The second pre-encapsulation material 740b may be a metal or metal alloy material as mentioned above. The second pre-encapsulation material 740b may be directly applied onto the first pre-encapsulation material 740a. Byway of example, the second layer of the second pre-encapsulation material 740b may partly or completely cover the peripheral surface of the first layer of the first pre-encapsulation material 740a.

Returning to FIG. 7A, pre-encapsulated semiconductor chips 100 (see FIG. 2E) may be placed over a temporary carrier 730. The pre-encapsulated semiconductor chips 100 may be manufactured in accordance with the above disclosure. The pre-encapsulated semiconductor chips 100 are placed over the temporary carrier 730 in a spaced-apart relationship. As mentioned before, the first pre-encapsulation material 740a may be made of ceramics, e.g. a non-oxide ceramics.

Then, as shown in FIG. 7B, the second pre-encapsulation material 740b is deposited on the surface of the first pre-encapsulation material 740a. The deposition of the second pre-encapsulation material 740b may be performed by metal plating, e.g. galvanic or electroless plating, or by a PVD or CVD process, or sputtering. It is to be noted that the second pre-encapsulation material 740b may be deposited over the pre-encapsulated semiconductor chip 100 and the temporary carrier 730 as a structured layer. Further, it is to be noted that other methods of producing the pre-encapsulated semiconductor chip 700 are available, e.g. methods in which an eWLP process is used for deposition of the second pre-encapsulation material 740b and for singulating the pre-encapsulated semiconductor chips 700.

Figure 8A:
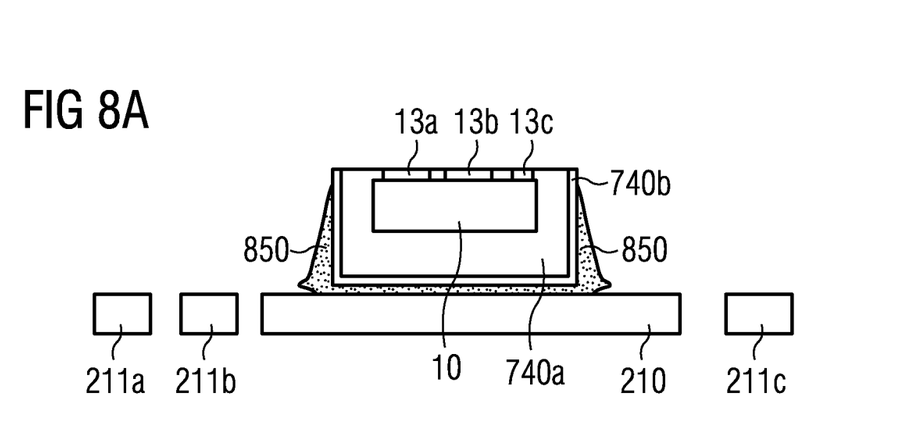
FIGS. 8A-8B schematically illustrate cross-sectional views of an exemplary process of manufacturing a semiconductor device comprising a pre-encapsulated semiconductor chip.

Referring to FIG. 8A, the pre-encapsulated semiconductor chip 700 is bonded to the carrier 210. Bonding the pre-encapsulated semiconductor chip 700 to the carrier 210 may be performed by soldering, e.g. by using a solder reflow process. As the pre-encapsulant 41 comprises an outer, second pre-encapsulation material 740b made of metal or a metal alloy, the pre-encapsulated semiconductor chip 700 may, e.g., be directly soldered to the carrier 210. A lateral solder cone 850 having slanting side faces may be used to increase the thermally effective footprint area of the pre-encapsulated semiconductor chip 700. Further, by choosing an appropriate thickness T1a of the first layer of the first pre-encapsulation material 740a and an appropriate thickness T1b of the second layer of the second pre-encapsulation material 740b, the thermal behavior of the pre-encapsulant 41 comprising these two layers may be set. In particular, this may relate to the thermal behavior of the pre-encapsulant 41 in view of dynamic and stationary thermal power dissipation. By way of example, the first layer of a first pre-encapsulation material 740*a* may have a thickness T1a similar or identical to the thickness T1 as mentioned before. The second layer of the second pre-encapsulation material 740*b* may have a thickness T1b smaller than T1a, e.g. T1b may be equal to or smaller than 20 µm, 10 µm, or 5 µm.

Figure 8B:
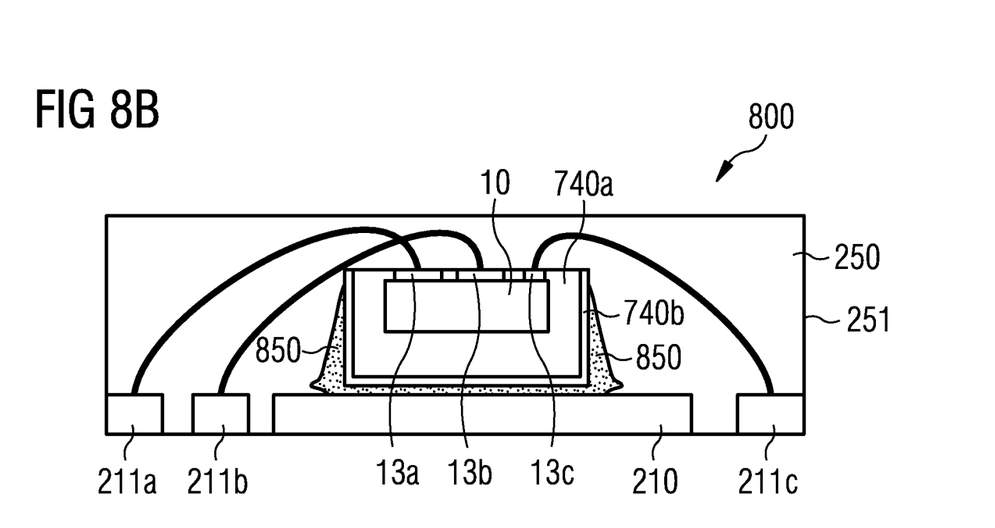

FIG. 8B illustrates a semiconductor device 800 containing the pre-encapsulated semiconductor chip 700. Reference is made to the description above in order to avoid reiteration. Thus, by way of example, the semiconductor device 800 could also employ a vertical semiconductor chip 10B in accordance with semiconductor device 100B. In this case, an electrical feed-through 41*a* could electrically connect the electrode 13*b* located at the second (bottom) surface of the semiconductor chip 10B with the second layer of the second pre-encapsulation material 740*b*.

Figure 9A:
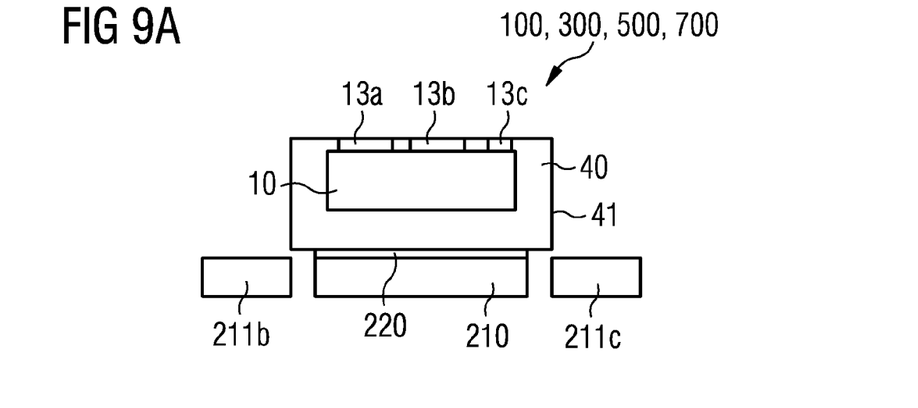
FIGS. 9A-9C schematically illustrate cross-sectional views of an exemplary process of manufacturing a semiconductor device comprising a pre-encapsulated semiconductor chip.
Figure 9B:
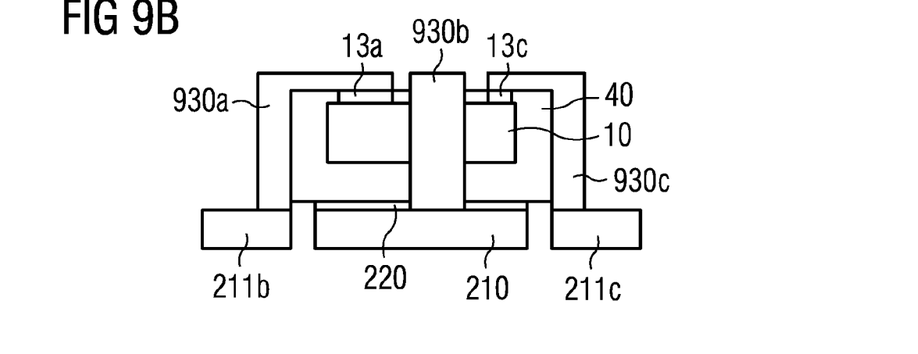
Figure 9C:
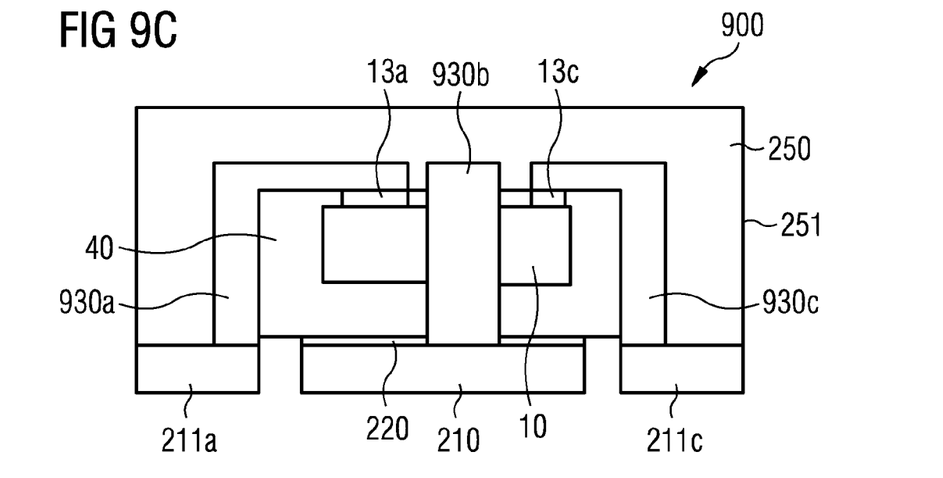

FIGS. 9A-9C schematically illustrate cross-sectional views of an exemplary process of manufacturing a semiconductor device 900 comprising a pre-encapsulated semiconductor chip. The pre-encapsulated chip may be of any of the designs of pre-encapsulated semiconductor chips 100, 300, 500, or 700, and may be of any of the types of pre-encapsulated semiconductor chips 100A or 100B as described above.

According to FIG. 9B, electrical contacts 930*a*, 930*b*, 930*c* may then be formed over the pre-encapsulant 41. The electrical contacts 930*a*, 930*b*, 930*c* may be formed by metal deposition and structuring techniques, e.g. by galvanic or electroless deposition of metal over the pre-encapsulant 41 and by photolithographic structuring. The electrical contacts 930*a*, 930*b*, 930*c* extend along and are supported by the peripheral surface of the pre-encapsulant 41. Depending on the material 40 of the pre-encapsulant 41, the electrical contacts 930*a*, 930*b*, 930*c* may be directly formed onto the pre-encapsulant 41 or onto an adhesive and/or insulating intermediate layer (not shown) previously applied onto the peripheral surface of the pre-encapsulant 41. By way of example, the contact pads 211*a*, 211*c* may be electrically connected to the electrodes 13*a*, 13*c*, respectively, and the carrier 210 may be electrically connected to the electrode 13*b*. If a vertical semiconductor chip 10B is used, a feed-through 41*a* (see FIG. 1B) could be used instead of electrical contact 930*b*. Any other techniques for forming an electrical interconnect such as, e.g., wire bonding, clip bonding, ribbon bonding, galvanic interconnects, etc. may be omitted.

Referring to FIG. 9C, the electrically insulating material 250 may then be applied by, e.g., molding or lamination to form the encapsulation body 251. The encapsulation body 251 may partly or completely embed the electrical wires 930*a*, 930*b*, 930*c*, the pre-encapsulated semiconductor chip 100, 300, 500, 700 and, e.g., the bonding layer 220. The Reference is made to the description above in order to avoid reiteration.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a carrier;
    a semiconductor chip disposed over the carrier, wherein the semiconductor chip has a first surface and a second surface opposite to the first surface, and wherein the second surface faces the carrier;
    an encapsulant covering at least partially the second surface of the semiconductor chip and at least partially a side wall surface of the semiconductor chip, wherein the encapsulant comprises a thermal conductivity of equal to or greater than 10 W/(m·K) and a specific heat capacity of equal to or greater than 0.2 J/(g·K); and
    an electrically insulating encapsulation material forming an encapsulation body covering at least partially the first surface of the semiconductor chip and the encapsulant at the side wall surface of the semiconductor chip.

2. The semiconductor device of claim 1, wherein the encapsulant has a thickness above the second surface of equal to or greater than 20 µm.

3. The semiconductor device of claim 1, wherein the encapsulant has a thickness above the side wall surface of equal to or greater than 20 µm.

4. The semiconductor device of claim 1, wherein the first surface is an active surface of the semiconductor chip and the second surface is a non-active surface of the semiconductor chip.

5. The semiconductor device of claim 1, wherein the encapsulant comprises a layer of ceramics or a metal layer or a multi-layer structure comprising a layer of ceramics and a metal layer.

6. The semiconductor device of claim 1, wherein the encapsulant comprises a thermal conductivity of equal to or greater than 40 W/(m·K).

7. The semiconductor device of claim 1, wherein the encapsulant comprises a specific heat capacity of equal to or greater than 0.4 J/(g·K).

8. The semiconductor device of claim 1, wherein the second surface of the semiconductor chip is void of any chip electrode.

9. The semiconductor device of claim 1, wherein the semiconductor chip is a power chip based on GaN, SiGe, GaAs, AlGaN, InGaAs, InAlAs, SiC or Si.

10. The semiconductor device of claim 1, wherein the encapsulant completely covers the second surface of the semiconductor chip.

11. The semiconductor device of claim 1, wherein the encapsulant predominantly covers the side wall surface of the semiconductor chip.

12. A semiconductor device, comprising:
    a carrier;
    a semiconductor chip disposed over the carrier, wherein the semiconductor chip has a first surface and a second surface opposite to the first surface, and wherein the second surface faces the carrier; and
    an encapsulant covering at least partially the second surface of the semiconductor chip and at least partially a side wall surface of the semiconductor chip, wherein the encapsulant comprises a thermal conductivity of equal to or greater than 10 W/(m·K) and a specific heat capacity of equal to or greater than 0.2 J/(g·K),
    wherein the encapsulant has a thickness above the second surface of equal to or greater than 20 µm.

13. A semiconductor device, comprising:
    a carrier;
    a semiconductor chip disposed over the carrier, wherein the semiconductor chip has a first surface and a second surface opposite to the first surface, and wherein the second surface faces the carrier; and
    an encapsulant covering at least partially the second surface of the semiconductor chip and at least partially a side wall surface of the semiconductor chip, wherein the encapsulant comprises a thermal conductivity of equal to or greater than 10 W/(m·K) and a specific heat capacity of equal to or greater than 0.2 J/(g·K), wherein the encapsulant has a thickness above the side wall surface of equal to or greater than 20 μm.

14. A semiconductor device, comprising:

a carrier;

a semiconductor chip disposed over the carrier, wherein the semiconductor chip has a first surface and a second surface opposite to the first surface, and wherein the second surface faces the carrier; and an encapsulant covering at least partially the second surface of the semiconductor chip and at least partially a side wall surface of the semiconductor chip, wherein the encapsulant comprises a thermal conductivity of equal to or greater than 10 W/(m·K) and a specific heat capacity of equal to or greater than 0.2 J/(g·K), wherein the encapsulant comprises a thermal conductivity of equal to or greater than 40 W/(m·K).

* * * * *